US012562696B2

(12) United States Patent      (10) Patent No.:   US 12,562,696 B2
Scott et al.          (45) Date of Patent:     Feb. 24, 2026

(54) LOW NOISE AMPLIFIER (LNA) WITH DISTORTION AND NOISE CANCELLATION

(71) Applicant: Qorvo US, Inc., Greensboro, NC (US)

(72) Inventors: Baker Scott, San Jose, CA (US);
George Maxim, Saratoga, CA (US);
Mostafa Savadi Osgooei, Linz (AT);
Padmmasini Desikan, Little Elm, TX
(US)

(73) Assignee: Qorvo US, Inc., Greensboro, NC (US)

( * ) Notice: Subject to any disclaimer, the term of this
patent is extended or adjusted under 35
U.S.C. 154(b) by 402 days.

(21) Appl. No.: 18/133,143

(22) Filed: Apr. 11, 2023

(65) Prior Publication Data

US 2023/0378920 A1     Nov. 23, 2023

Related U.S. Application Data

(63) Continuation-in-part of application No. 18/298,426,
filed on Apr. 11, 2023.

(60) Provisional application No. 63/375,064, filed on Sep.
9, 2022, provisional application No. 63/400,502, filed
on Aug. 24, 2022, provisional application No.
63/342,678, filed on May 17, 2022.

(51) Int. Cl.
*H03F 3/21*        (2006.01)
*H03F 1/56*        (2006.01)

(52) U.S. Cl.
CPC ............... *H03F 3/211* (2013.01); *H03F 1/56*
(2013.01); *H03F 2200/294* (2013.01); *H03F
2200/451* (2013.01)

(58) Field of Classification Search
CPC ...... H03F 3/211; H03F 1/56; H03F 2200/294;
H03F 2200/451

USPC ......................................................... 330/295
See application file for complete search history.

(56) References Cited

U.S. PATENT DOCUMENTS

| | | |
|---|---|---|
| 7,496,334 B2 | 2/2009 | Saito |
| 10,903,798 B2 * | 1/2021 | Bozorg ..................... H03F 3/19 |

(Continued)

FOREIGN PATENT DOCUMENTS

| | | | |
|---|---|---|---|
| CN | 103414439 B | * | 8/2016 |
| KR | 20200128870 A | | 11/2020 |

OTHER PUBLICATIONS

Jafari et al., "A sub-1V dual-path noise and distortion canceling
CMOS LNA for low power wireless applications", Microelectronics
Journal 104903, 2020 (Year: 2020).*

(Continued)

*Primary Examiner* — Hafizur Rahman
(74) *Attorney, Agent, or Firm* — Withrow & Terranova,
P.L.L.C.

(57) ABSTRACT

Low noise amplifiers (LNAs) are disclosed. In one aspect,
an LNA may have distortion cancellation that is orthogo-
nally implemented relative to noise cancellation such that
changes to the distortion cancellation do not affect the noise
cancellation. In further exemplary aspects, cancellation cir-
cuitry is added in parallel to a main or primary LNA path.
The cancellation circuitry may include an initial impedance
matching amplifier that effectuates noise cancellation and a
second amplifier that effectuates distortion cancellation.
Variations in the placement and composition of the second
amplifier are provided. By providing a second path that
allows for independent control of noise and distortion can-
cellation, overall performance of the LNA is improved.

17 Claims, 9 Drawing Sheets

(56)                References Cited

U.S. PATENT DOCUMENTS

| | | | |
|---|---|---|---|
| 2008/0089440 A1 | 4/2008 | Curtis | |
| 2010/0046769 A1* | 2/2010 | Kimura | G10K 11/17885 |
| | | | 381/71.1 |
| 2012/0299651 A1 | 11/2012 | Goel et al. | |
| 2016/0232886 A1* | 8/2016 | Vaidhyanathan | G10K 11/178 |
| 2023/0378913 A1 | 11/2023 | Osgooei | |

OTHER PUBLICATIONS

Chen, W.-H. et al., "A Highly Linear Broadband CMOS LNA Employing Noise and Distortion Cancellation," IEEE Journal of Solid-State Circuits, vol. 43, No. 5, May 2008, IEEE, pp. 1164-1176.

Guo, B. et al., "A linearized common-gate low-noise amplifier using active cross-coupled feedback technique," Analog Integrated Circuits and Signal Processing, vol. 89, Issue 1, Oct. 2016, Springer Science+Business Media, pp. 239-248.

Kim, J. et al., "Wideband Inductorless Balun-LNA Employing Feedback for Low-Power Low-Voltage Applications," IEEE Transactions on Microwave Theory and Techniques, vol. 60, No. 9, Sep. 2012, IEEE, pp. 2833-2842.

Pang-Hsing, C. et al., "A Highly Linear Broadband CMOS LNA with Noise Cancellation," 2012 Spring Congress on Engineering and Technology, May 2012, IEEE, 4 pages.

Wang, H. et al., "A Wideband Inductorless LNA With Local Feedback and Noise Cancelling for Low-Power Low-Voltage Applications," IEEE Transactions on Circuits and Systems—I: Regular Papers, vol. 57, No. 8, Aug. 2010, IEEE, pp. 1993-2005.

Zhang, H. et al., "Linearization Techniques for CMOS Low Noise Amplifiers: A Tutorial," IEEE Transactions on Circuits and Systems—I: Regular Papers, vol. 58, No. 1, Jan. 2011, IEEE, pp. 22-36.

Extended European Search Report for European Patent Application No. 23174050.7, mailed Oct. 10, 2023, 11 pages.

Extended European Search Report for European Patent Application No. 23171220.9, mailed Oct. 11, 2023, 28 pages.

Blaakmeer, S. et al., "Wideband Balun-LNA With Simultaneous Output Balancing, Noise-Canceling and Distortion-Canceling," IEEE Journal of Solid-State Circuits, vol. 43, No. 6, Jun. 2008, IEEE, pp. 1341-1350.

Bruccoleri, F. et al., "Wide-band CMOS low-noise amplifier exploiting thermal noise canceling," IEEE Journal of Solid-State Circuits, vol. 39, No. 2, Feb. 2004, IEEE, 8 pages.

Wang, K. et al., "An Inductorless and Capacitorless LNA with Noise and Distortion Cancelation," 2011 3rd International Conference on Computer Research and Development, Mar. 11-13, 2011, Shanghai, China, IEEE, 5 pages.

* cited by examiner

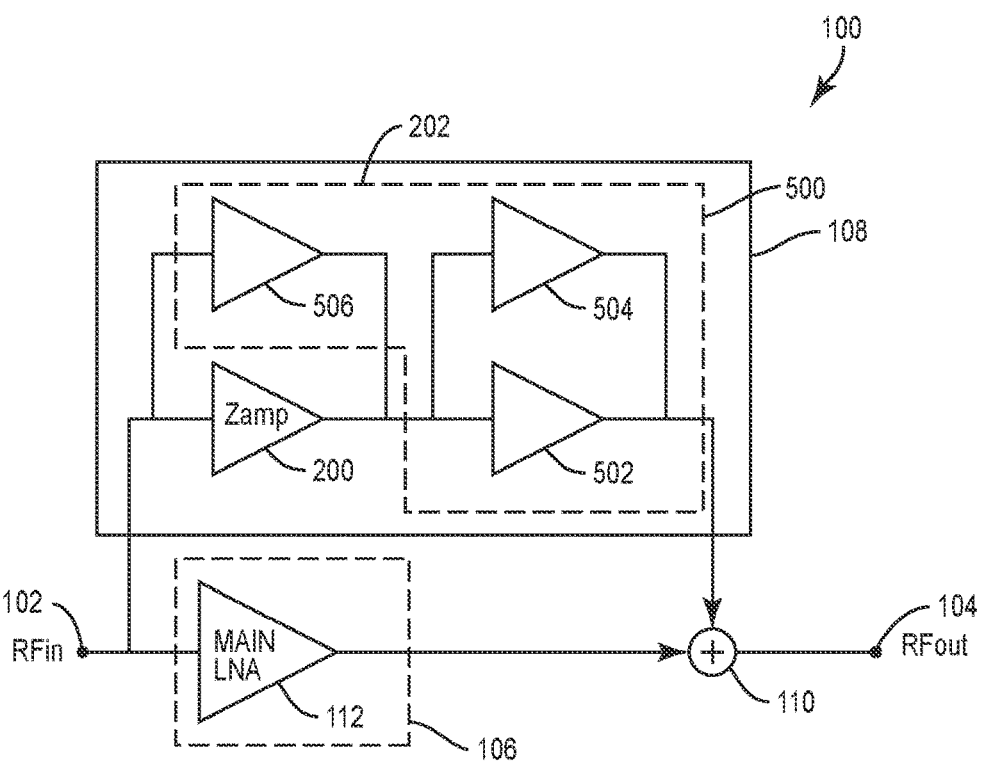
FIG. 5
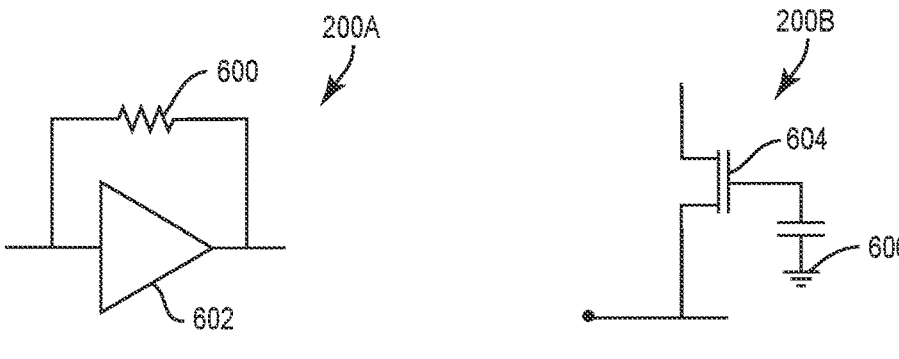
FIG. 6A                    FIG. 6B
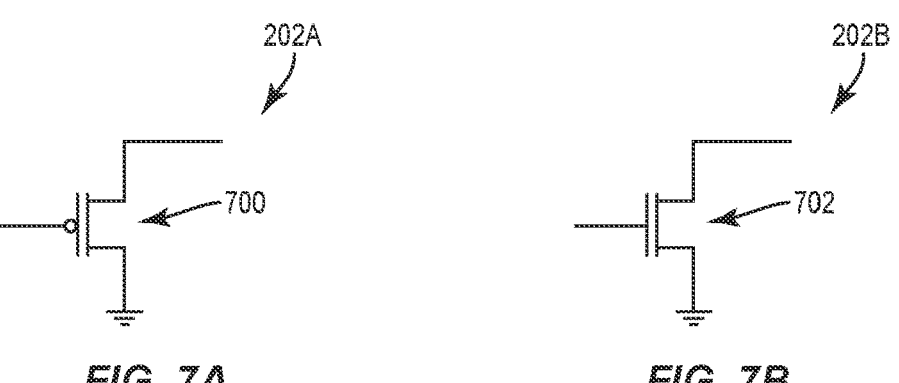
FIG. 7A                    FIG. 7B

LOW NOISE AMPLIFIER (LNA) WITH DISTORTION AND NOISE CANCELLATION

PRIORITY CLAIM

The present application claims priority to U.S. Provisional Patent Application Ser. No. 63/375,064, filed on Sep. 9, 2022, and entitled "LOW NOISE AMPLIFIER (LNA) WITH DISTORTION AND NOISE CANCELLATION," the contents of which are incorporated herein by reference in its entirety.

The present application claims priority to U.S. Provisional Patent Application Ser. No. 63/342,678, filed on May 17, 2022, and entitled "COMPACT INDUCTOR-LESS LNA WITH DUAL-PATH DISTORTION CANCELLATION AND ACTIVE INPUT MATCH WITH NOISE CANCEL-LATION," the contents of which are incorporated herein by reference in its entirety.

The present application also claims priority to U.S. patent application Ser. No. 18/298,426, entitled INDUCTORLESS SELF-TUNED INPUT-MATCHING LOW-NOISE AMPLI-FIER WITH VERY LOW NOISE FIGURE AND Gm BOOST and filed Apr. 11, 2023. U.S. patent application Ser. No. 18/298,426 claims the benefit of U.S. Provisional Patent Application Ser. No. 63/375,064, filed Sep. 9, 2022; U.S. Provisional Patent Application Ser. No. 63/400,502, filed Aug. 24, 2022; and U.S. Provisional Patent Application Ser. No. 63/342,678, filed May 17, 2022. The disclosures of all of these applications are hereby incorporated herein by reference in their entirety.

BACKGROUND

I. Field of the Disclosure

The technology of the disclosure relates generally to low noise amplifiers, such as may be found in receivers or transceivers.

II. Background

Computing devices abound in modern society, and more particularly, mobile communication devices have become increasingly common. The prevalence of these mobile com-munication devices is driven in part by the many functions that are now enabled on such devices. Increased processing capabilities in such devices mean that mobile communica-tion devices have evolved from pure communication tools into sophisticated mobile entertainment centers, thus enabling enhanced user experiences. With the advent of the myriad functions available to such devices, there has been increased pressure to find ways to improve data transfer, such as by increasing data transfer rates. One prevalent way to increase data transfer rates is through increasing the carrier frequency over which data is transferred, as evi-denced by the frequency ranges used by Fifth Generation-New Radio (5G-NR) cellular technologies compared to earlier generations of cellular technologies. With these elevated frequencies, additional demands are placed on amplifiers in both the transmit and receive chains of trans-ceivers. These additional demands provide room for inno-vation.

SUMMARY

Aspects disclosed in the detailed description include low noise amplifiers (LNAs) with distortion and noise cancellation. In an exemplary aspect, an LNA may have distortion cancellation that is orthogonally implemented relative to noise cancellation such that changes to the distortion can-cellation do not affect the noise cancellation. In further exemplary aspects, cancellation circuitry is added in parallel to a main or primary LNA path. The cancellation circuitry may include an initial impedance matching amplifier that effectuates noise cancellation and a second amplifier that effectuates distortion cancellation. Variations in the place-ment and composition of the second amplifier are provided. By providing a second path that allows for independent control of noise and distortion cancellation, overall perfor-mance of the LNA is improved.

In this regard, in one aspect, a power amplifier (PA) module is disclosed. The PA module comprises a first path coupling an input node and an output node, the first path comprising an LNA. The PA module also comprises a second path coupling the input and output nodes. The second path is electrically parallel to the first path. The second path comprises cancellation circuitry. The cancellation circuitry comprises a noise cancellation circuit and a distortion can-cellation circuit.

In another aspect, a low noise amplifying system is disclosed. The low noise amplifying system comprises a first signal path comprising an amplifying path. The low noise amplifying system also comprises a second signal path comprising a cancellation path configured to cancel noise and distortion independently. Devices in the amplifying path are configured to create distortion having a first value and a first sign, and devices in the second signal path are config-ured to create distortion having approximately the first value and a second sign opposite the first sign.

BRIEF DESCRIPTION OF THE DRAWINGS

FIG. 5 is a more detailed diagram of the amplifier module of FIG. 2A with three distortion cancellation circuits to cancel second and third order distortion;

FIG. 6A is a first exemplary aspect of a noise cancellation circuit;

FIG. 6B is a second exemplary aspect of a noise cancel-lation circuit;

FIG. 7A is a first exemplary aspect of a distortion can-cellation circuit;

FIG. 7B is a second exemplary aspect of a distortion cancellation circuit;

DETAILED DESCRIPTION

Figure 1:
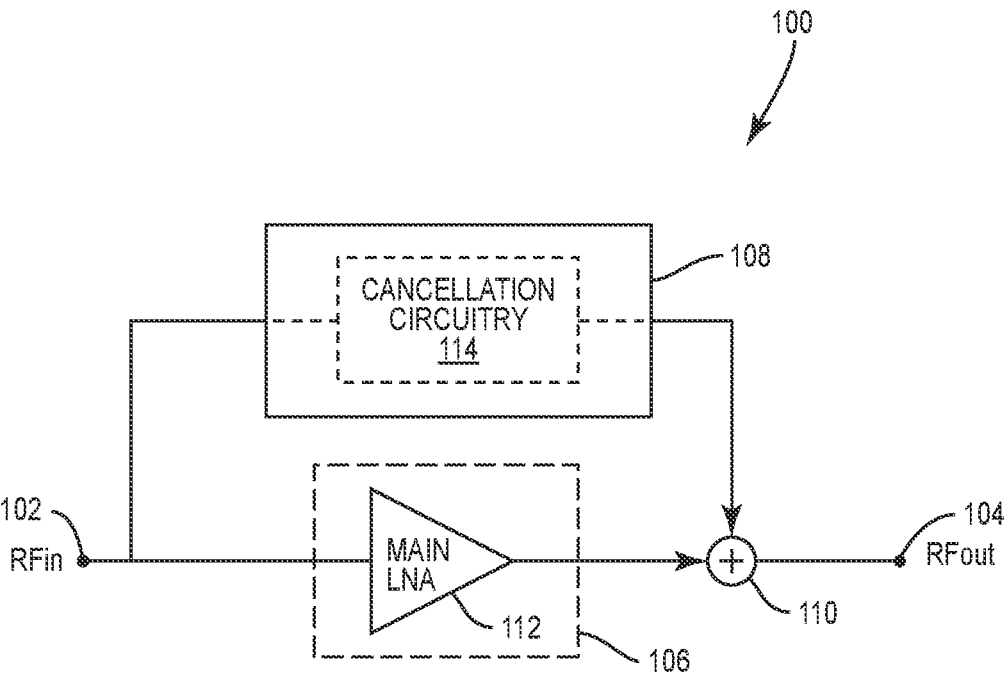
FIG. 1 is a block diagram of an exemplary amplifier module having two paths, where a first path includes a low noise amplifier (LNA) stage, and a second path includes cancellation circuitry according to exemplary aspects of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that although the terms first, second, etc. may be used herein to describe various elements, these elements should not be limited by these terms. These terms are only used to distinguish one element from another. For example, a first element could be termed a second element, and similarly, a second element could be termed a first element without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, no intervening elements are present when an element is referred to as being "directly on" or extending "directly onto" another element. Likewise, it will be understood that when an element such as a layer, region, or substrate is referred to as being "over" or extending "over" another element, it can be directly over or extend directly over the other element, or intervening elements may also be present. In contrast, no intervening elements are present when an element is referred to as being "directly over" or extending "directly over" another element. It will also be understood that when an element is referred to as being "connected" or "coupled" to another element, it can be directly connected or coupled to the other element, or intervening elements may be present. In contrast, no intervening elements are present when an element is referred to as being "directly connected" or "directly coupled" to another element.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include low noise amplifiers (LNAs) with distortion and noise cancellation. In an exemplary aspect, an LNA may have distortion cancellation that is orthogonally implemented relative to noise cancellation such that changes to the distortion cancellation do not affect the noise cancellation. In further exemplary aspects, cancellation circuitry is added in parallel to a main or primary LNA path. The cancellation circuitry may include an initial impedance matching amplifier that effectuates noise cancellation and a second amplifier that effectuates distortion cancellation. Variations in the placement and composition of the second amplifier are provided. By providing a second path that allows for independent control of noise and distortion cancellation, overall performance of the LNA is improved.

It should be appreciated that normally an LNA has desired performance characteristics with "low noise," generally linear operation over the frequencies of interest, and a generally low-power use profile (particularly for mobile computing applications). Competing against these desired performance characteristics are the inherent non-linearities and noise of the transistors used to provide the main amplification within the LNA. Traditional approaches are typically current intensive and use relatively large inductors to compensate for the noise. Such approaches are expensive and may compromise desired power consumption levels. Likewise, such approaches typically compensate for noise at the expense of distortion or vice versa as the compensation circuitry is shared, leading to compromises in cancellation.

Exemplary aspects of the present disclosure provide an inductor-less technique to provide independent or orthogonal control of circuitry to provide distortion cancellation and noise cancellation. This cancellation circuitry is provided in a path parallel to the main LNA path and may take a variety of configurations.

In this regard, FIG. 1 is a block diagram of an amplifier module 100 that may operate as an LNA stage within a receive chain of a transceiver or the like. The amplifier module 100 includes an input node 102 and an output node 104. The amplifier module 100 further includes a primary, main, or first path 106 between the input node 102 and the output node 104. The amplifier module 100 further includes a second path 108 between the input node 102 and the output node 104. The first path 106 and the second path 108 may be joined at the output node 104 through a summation circuit 110.

With continued reference to FIG. 1, the first path 106 may include a main LNA 112. Similarly, the second path 108 may include cancellation circuitry 114. The use of the second path 108 and cancellation circuitry 114 allows for the elimination of off-chip inductors, thereby saving space and power. Further, the use of the second path 108 allows for current reuse, as will be explained in greater detail below. More details are provided in subsequent Figures.

Figure 2A:
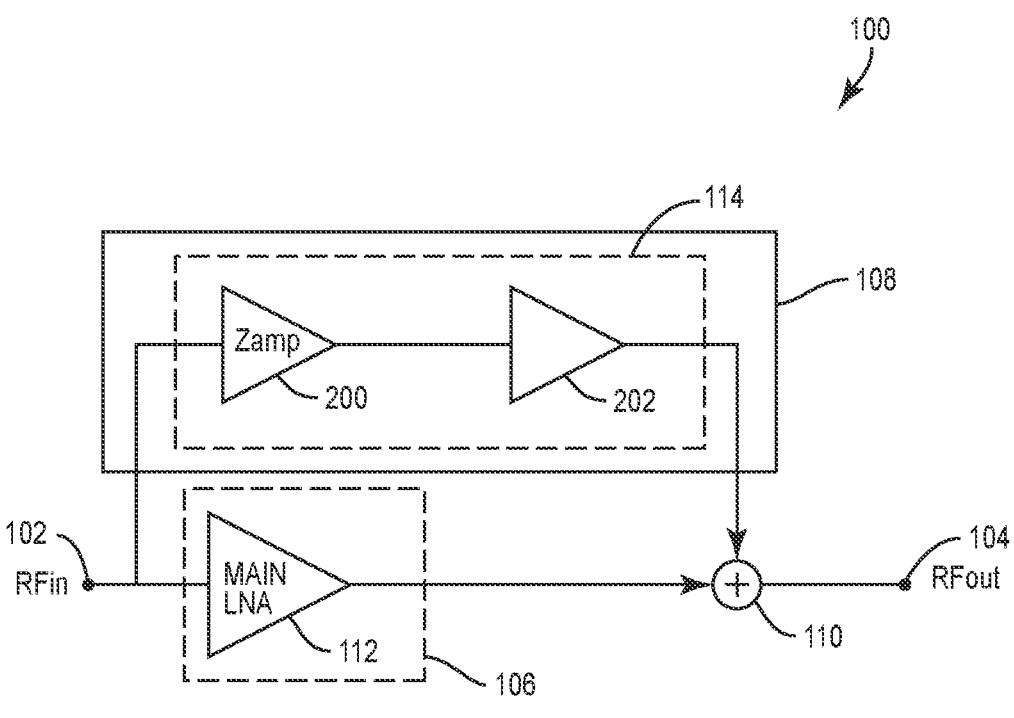
FIG. 2A is a more detailed diagram of the amplifier module of FIG. 1 with noise cancellation circuitry and distortion cancellation circuitry illustrated in the second path along with a summation point after the LNA stage.

In this regard, FIG. 2A provides some additional detail about the cancellation circuitry 114. Specifically, the cancellation circuitry 114 may include a noise canceling amplifier 200 (also referred to as Zamp in the Figures), which provides impedance matching such that the main LNA 112 presents a standard impedance (e.g., 50 ohms(Ω)) at the input node 102. The cancellation circuitry 114 may further include a distortion canceling amplifier 202, which may provide opposite sign distortion relative to the main LNA 112. As with FIG. 1, the summation circuit 110 occurs after the main LNA 112.

Figure 2B:
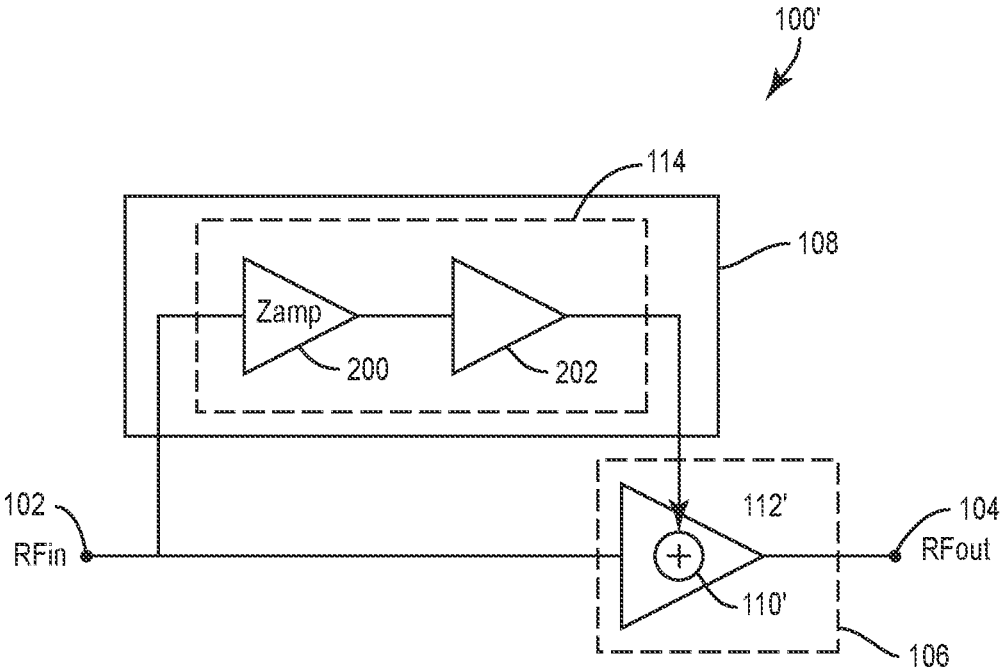
FIG. 2B is a more detailed diagram of the amplifier module of FIG. 1 with noise cancellation circuitry and distortion cancellation circuitry illustrated in the second path along with a summation point within the LNA stage.

In contrast, FIG. 2B illustrates an alternate amplifier module 100' where a summation circuit 110' is provided within the circuitry of the main LNA 112'. More detail about this possible configuration is provided below with reference to FIG. 8. This use of the first path 106 and the second path 108 is consistent with the theories of the present disclosure.

Figure 3:
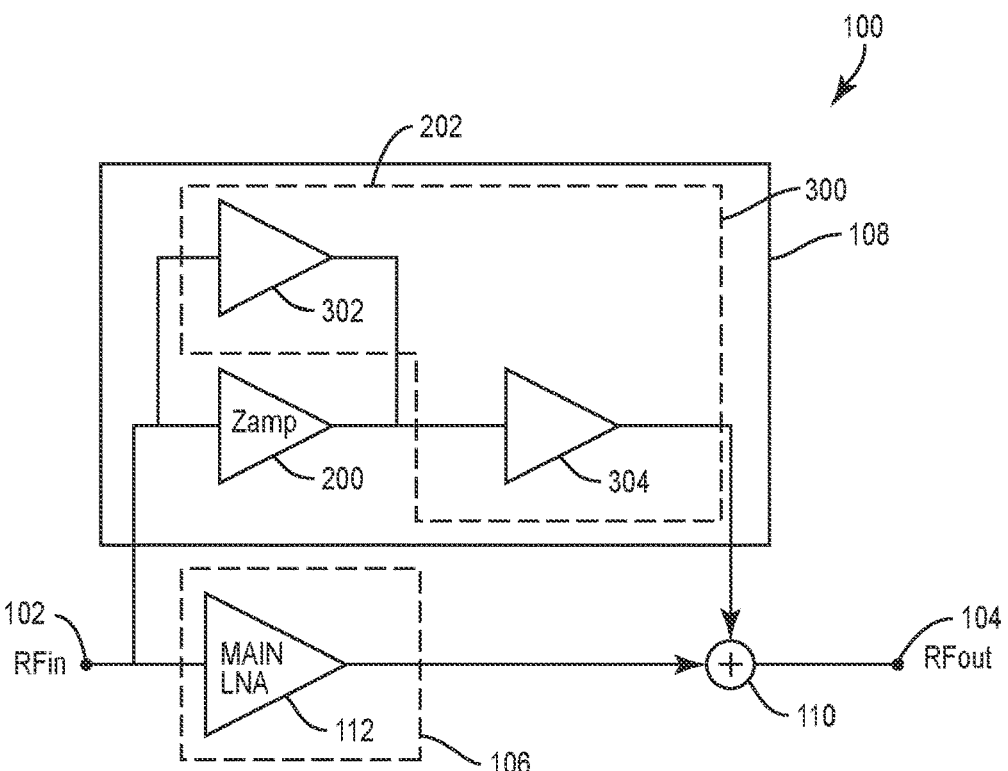
FIG. 3 is a more detailed diagram of the amplifier module of FIG. 2A with two distortion cancellation circuits in series to cancel second and third order distortion.

FIG. 3 provides more detail about the amplifier module 100. Specifically, the second path 108 may include the noise canceling amplifier 200 as previously described. The distortion canceling amplifier 202 is instantiated by a distortion canceling amplifier chain 300 having a first distortion canceling amplifier 302 electrically in series with a second distortion canceling amplifier 304. In a first exemplary aspect, the first distortion canceling amplifier 302 may cancel second order distortion from the main LNA 112, and the second distortion canceling amplifier 304 may cancel third order distortion from the main LNA 112. While it is contemplated that the first distortion canceling amplifier 302 may cancel second order distortion, the first distortion canceling amplifier 302 may instead cancel third order distortion, and the second distortion canceling amplifier 304 cancel second order distortion. By having two distortion canceling amplifiers 302, 304, both second and third order distortion may be addressed independently (i.e., orthogonally) from one another and independently of the noise canceling amplifier 200.

Figure 4:
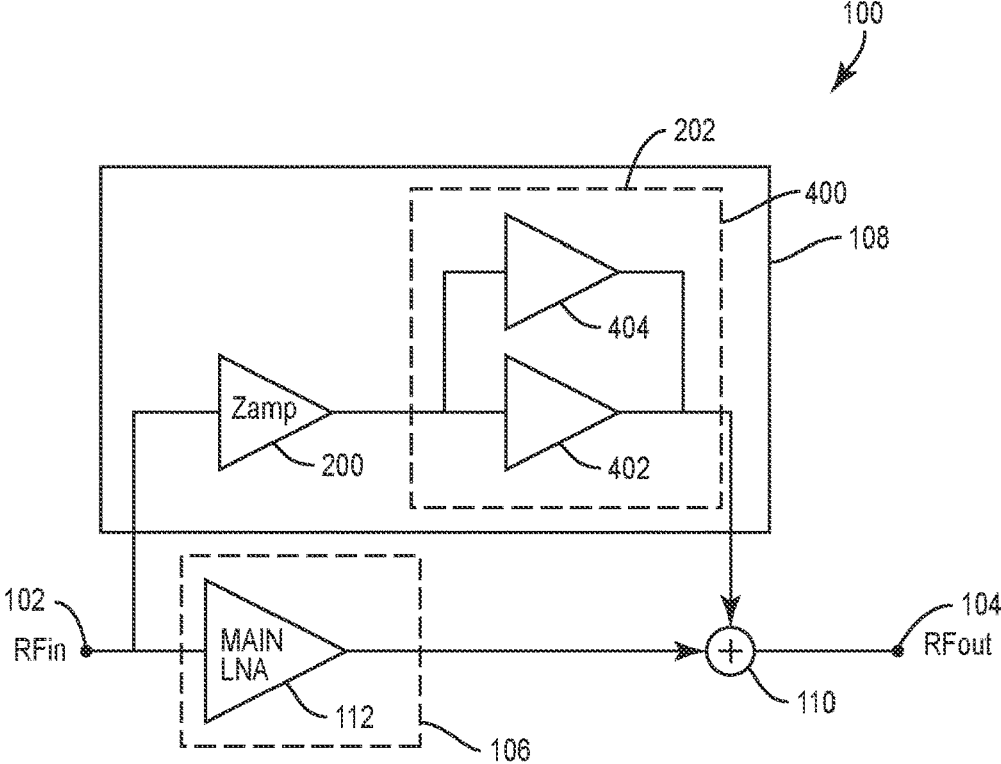
FIG. 4 is a more detailed diagram of the amplifier module of FIG. 2A with two distortion cancellation circuits in parallel to cancel second and third order distortion.

FIG. 4 provides another example of the second path 108. The distortion canceling amplifier 202 is instantiated by a distortion canceling amplifier chain 400 having a first distortion canceling amplifier 402 electrically in parallel with a second distortion canceling amplifier 404. In a first exemplary aspect, the first distortion canceling amplifier 402 may cancel second order distortion from the main LNA 112, and the second distortion canceling amplifier 404 may cancel third order distortion from the main LNA 112.

FIG. 5 provides still another example of the second path 108. The distortion canceling amplifier 202 is instantiated by a distortion canceling amplifier chain 500, having a first distortion canceling amplifier 502 electrically in parallel with a second distortion canceling amplifier 504, while both are electrically in series with a third distortion canceling amplifier 506. In a first exemplary aspect, the first distortion canceling amplifier 502 may cancel third order distortion from the main LNA 112, and the second distortion canceling amplifier 504 may cancel second or third order distortion from the main LNA 112. The third distortion canceling amplifier 506 may cancel second or third order distortion from the main LNA 112 with the understanding that at least one of the second or third distortion canceling amplifiers 504, 506 cancel second order distortion such that the distortion canceling amplifier chain 500 cancels both second and third order distortion of the main LNA 112.

It should be appreciated that the noise canceling amplifier 200 may be formed from a variety of different circuits, two of which are set forth as noise canceling amplifiers 200A and 200B in FIGS. 6A and 6B, respectively. The noise canceling amplifier 200A is in a shunt feedback arrangement where a resistor 600 provides a feedback loop for a shunt feedback amplifier 602. In contrast, the noise canceling amplifier 200B is a common gate transistor arrangement where a gate 604 is coupled to ground 606. It should be appreciated that n-type field effect transistors (FETs) (NFETs) or p-type FETs (PFETs) may be used, or a combination (i.e., complementary) may be used. Likewise, the present disclosure is not limited to a specific material and may be silicon carbide (SiC), gallium arsenide (GaAs), gallium nitride (GaN), silicon (Si), germanium (Ge), or the like.

It should further be appreciated that the distortion canceling amplifier 202 may likewise be formed from a variety of different circuits, two of which are set forth as distortion canceling amplifiers 202A and 202B in FIGS. 7A and 7B, respectively. The distortion canceling amplifier 202A is a source following amplifier 700, while the distortion canceling amplifier 202B is a common source amplifier 702. Again, the particular material or type of FET may be varied as needed or desired without departing from the present disclosure. Likewise, any amplifiers discussed herein may be single ended, differential, quadrature, or the like.

In general, to effectuate distortion cancellation, the devices operate at different current levels. That is, a device with a high gain, low noise has a high current density and may be considered strongly inverted. Conversely, a device to cancel such strongly inverted devices should be weakly inverted and have relatively low current density.

Figure 8:
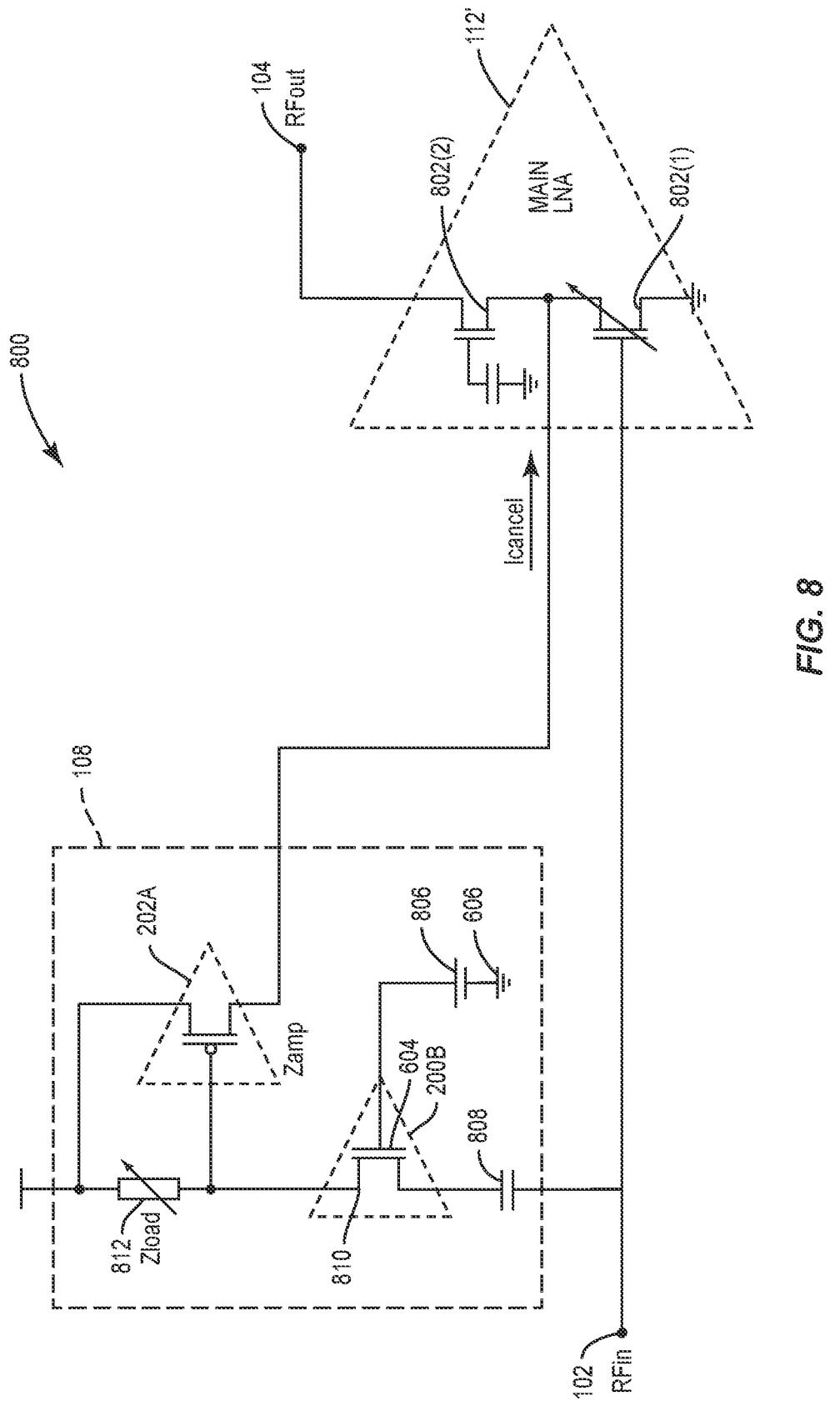
FIG. 8 is a block diagram of the amplifier module of FIG. 2B showing how an interior summation may be arranged.

FIG. 8 provides a hybrid view of a specific implementation of an amplifier module 800 based on the amplifier module 100' of FIG. 2B. The main LNA 112' is formed from cascoded amplifiers 802(1)-802(2), with a node 804 therebetween that acts as the summation circuit 110' where currents are summed. More specifically, a cancellation current Icancel is provided by the second path 108 to the node 804 and summed with the cascode current of the main LNA 112'.

With continued reference to FIG. 8, the second path 108 includes the noise canceling amplifier 200B, with the gate 604 coupled to ground 606 through a bias network 806. Further, the noise distortion canceling amplifier 200B may be alternating current (AC) coupled through a capacitor 808. A drain 810 of the noise canceling amplifier 200B is coupled to a variable Zload 812 and to the gate of the distortion canceling amplifier 202A. The distortion canceling amplifier 202A generates the cancellation current Icancel that is provided to the main LNA 112'. As shown, the noise canceling amplifier 200B may be in a high inversion state, while the distortion canceling amplifier 202A is in a weak inversion state. This arrangement also allows the current to be reused between the amplifiers 200B, 202A. Likewise, the current used by the second path 108 is substantially smaller than the current used by the first path 106 (e.g., a 90-10 split being contemplated). This current splitting is desirable because the most current is used to support the signal of interest rather than to cancel noise and distortion.

Figure 9:
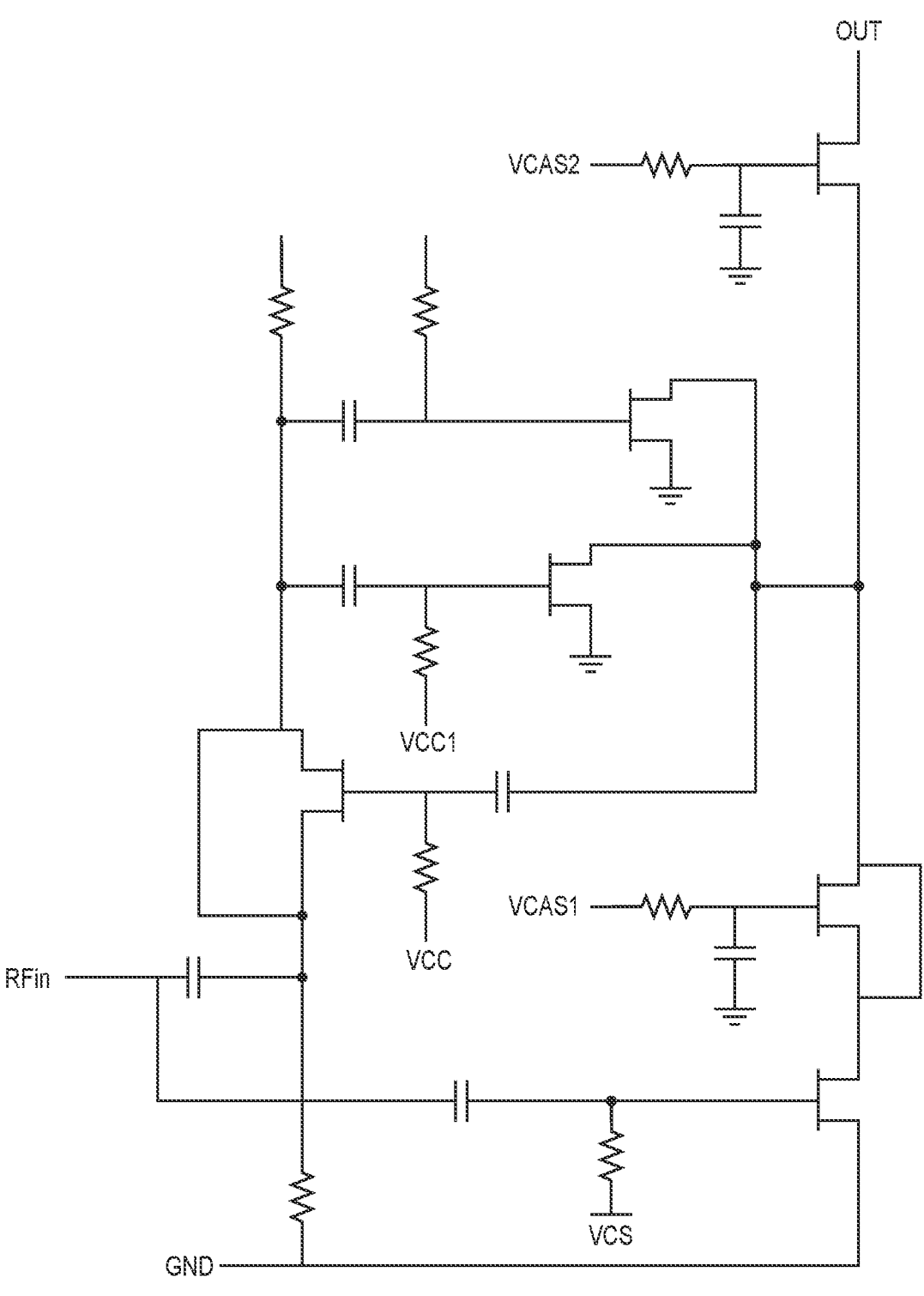
FIG. 9 is a circuit diagram of the amplifier module of FIG. 3 provided to facilitate how such a structure may be instantiated.

FIG. 9 is a circuit-level diagram of the amplifier module 100 using the arrangement of the distortion canceling amplifier chain 300 of FIG. 3. While a specific circuit is illustrated, it should be appreciated that there are other ways to achieve the same functionality. FIG. 9 is included to show possession of a working circuit.

Figure 10:
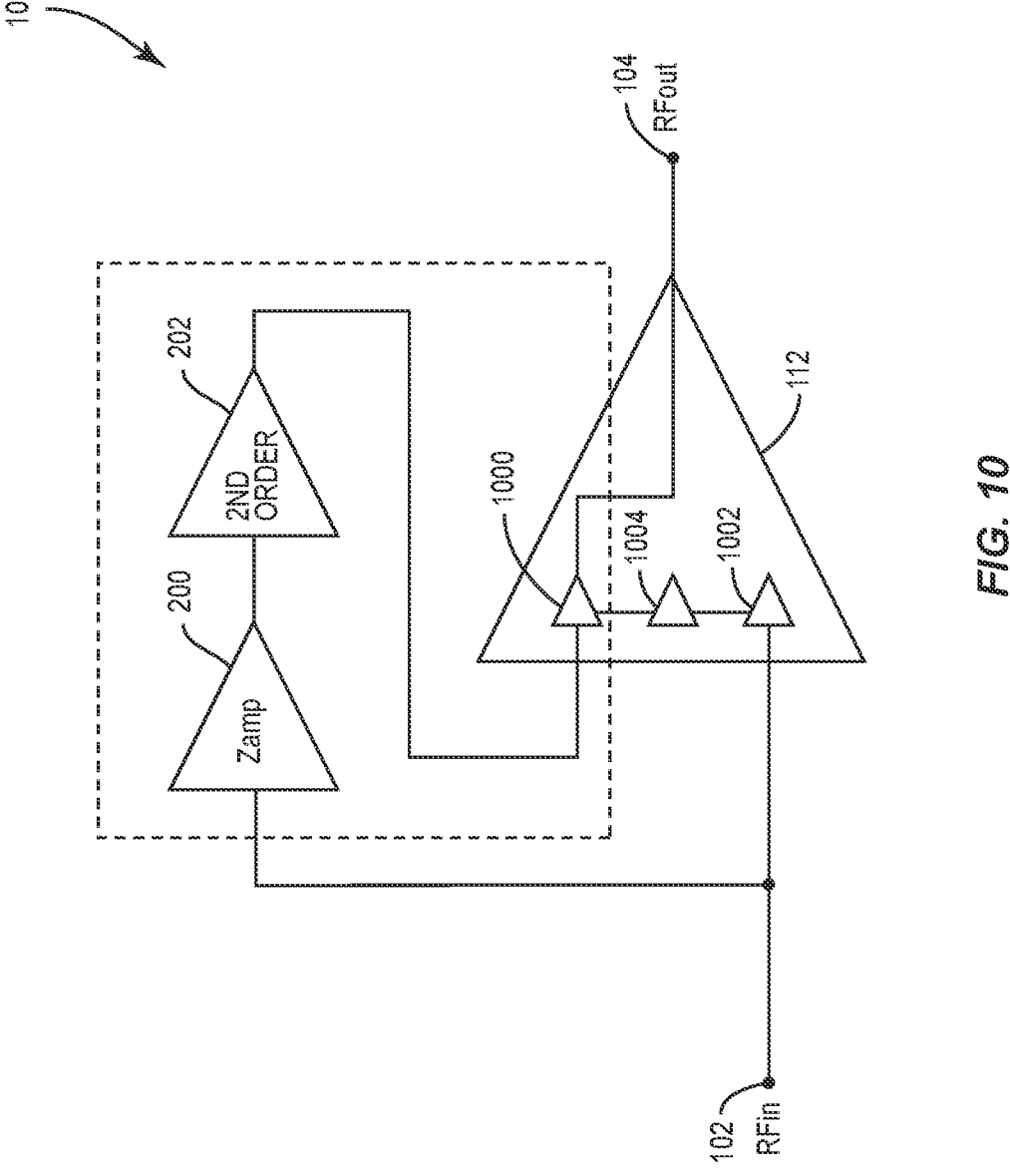
FIG. 10 is a block diagram of an exemplary aspect where additional distortion cancellation is provided by a cascode element within the LNA stage.

Note that it is also possible to use some of the cascode amplifiers of the main LNA 112 to provide additional distortion (e.g., third order distortion), as better seen in FIG. 10, where the main LNA 112 includes a cascode amplifier 1000 in addition to a main amplifier 1002 and another cascode amplifier 1004. The second path 108 has a noise canceling amplifier 200 and a distortion canceling amplifier 202, which may, for example, cancel second order distortion. The cascode amplifier 1000 may also be considered part of the second path 108 and may provide additional distortion cancellation.

Figure 11:
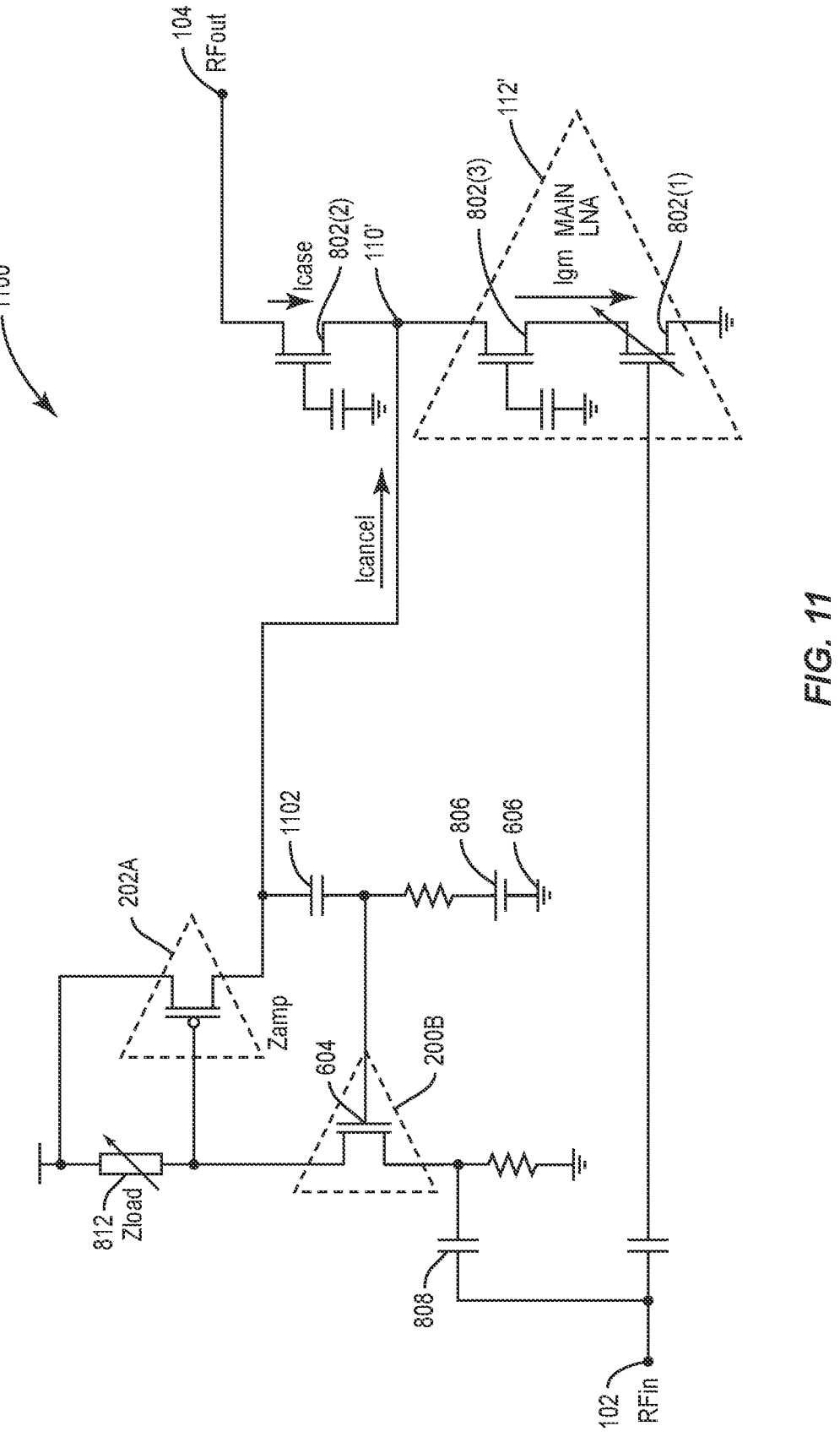
FIG. 11 is a block diagram of an alternate aspect of the amplifier module of FIG. 8 with current reuse highlighted.

More current reuse may be provided by changing the noise canceling amplifier from a grounded gate to a floating gate, as is better seen in FIG. 11. In most regards, the amplifier module 1100 of FIG. 11 is the same as the amplifier module 800 of FIG. 8, but the gate 604 is also coupled to the summation circuit 110' through a capacitor 1102, thereby forming feedback for the input impedance of the noise canceling amplifier 200B. By providing this linkage, current is reused within the noise canceling amplifier 200B, again reducing overall current use by the second path 108. Note that an additional cascode amplifier 802(3) may be added without departing from the present disclosure.

Figure 12:
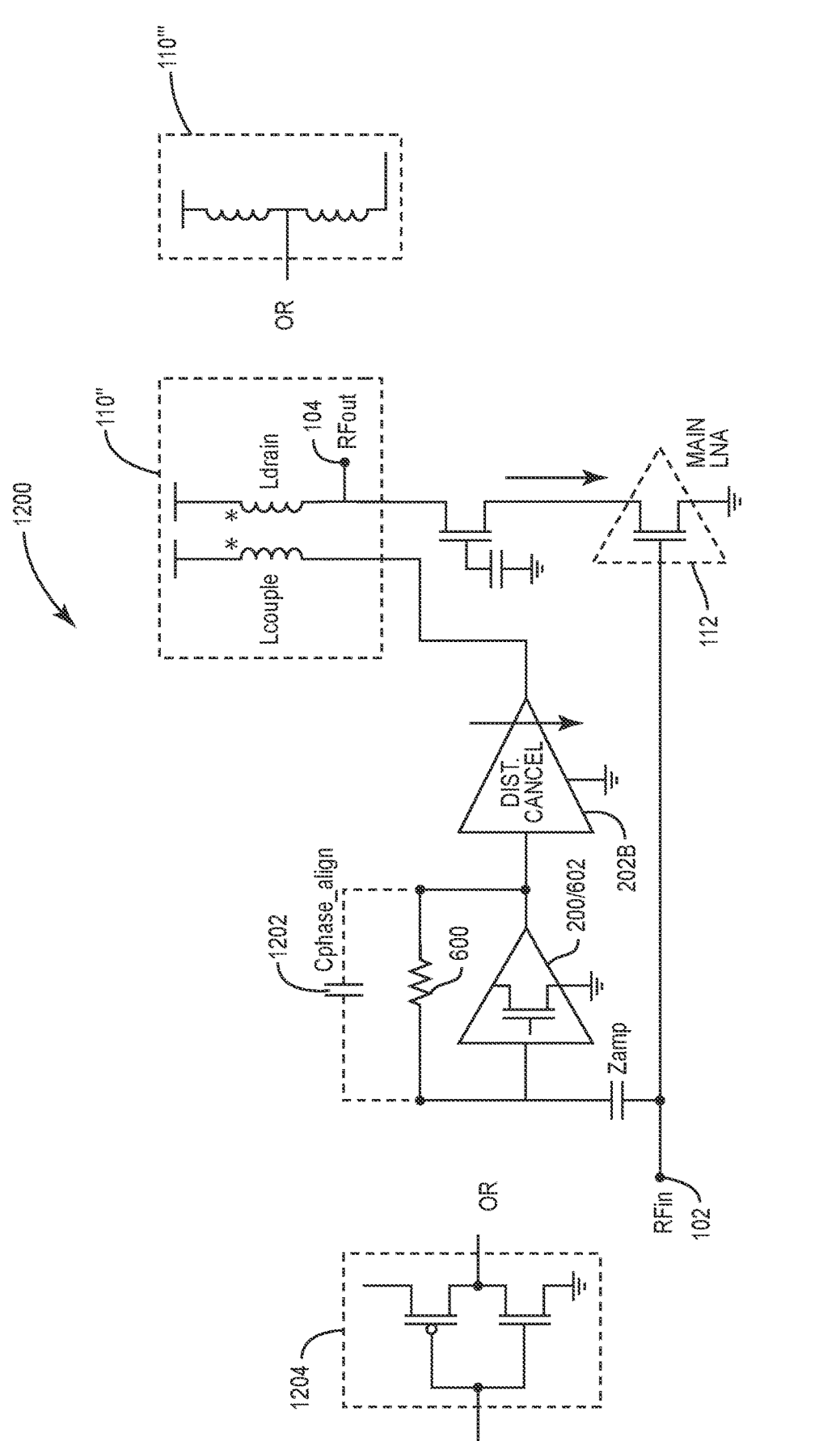
FIG. 12 is a block diagram showing details of an inductor-based summation circuit for the amplifier module of FIG. 2A.

While the aspects discussed above have contemplated a summation circuit 110, 110' that is current summation based, the present disclosure is not so limited. It is also possible to sum through a transformer, as illustrated in FIG. 12. Specifically, a power amplifier module 1200 includes a noise canceling amplifier 200, which may be a shunt feedback amplifier 602 with an additional capacitor 1202 parallel to the resistor 600. Equivalently, the shunt feedback amplifier 602 may be replaced by a circuit 1204. The output from the distortion canceling amplifier 202B is summed in a summation circuit 110'', which is an inverting transformer. Alternatively, the summation circuit 110'' may be replaced with inductors 110'''.

While not specifically illustrated, aspects of the present disclosure may incorporate some form of temperature compensation to assist in biasing the amplifiers properly. That is, amplifiers may operate differently at different temperatures. Accordingly, having, for example, a bandgap temperature reference may allow operation to be adjusted as needed to maintain desired operation.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

What is claimed is:

1. A power amplifier (PA) module comprising:
a first path coupling an input node and an output node, the first path comprising a low noise amplifier (LNA); and
a second path coupling the input node and the output node, the second path electrically parallel to the first path, the second path comprising cancellation circuitry comprising:
a noise cancellation circuit comprising a noise canceling amplifier configured to adjust an impedance at the input node; and
a distortion cancellation circuit, such that the PA module is inductor-less.

2. A low noise amplifying system comprising:
a first signal path comprising an amplifying path; and
a second signal path comprising a cancellation path configured to cancel noise and distortion independently,
wherein devices in the amplifying path are configured to create distortion having a first value and a first sign, and devices in the second signal path are configured to create distortion having approximately the first value and a second sign opposite the first sign, and
wherein the first signal path and the second signal path are inductor-less.

3. The PA module of claim 1, wherein the noise canceling amplifier comprises a common gate transistor.

4. The PA module of claim 1, wherein the noise canceling amplifier comprises a shunt feedback amplifier.

5. The PA module of claim 1, wherein the distortion cancellation circuit comprises a distortion canceling amplifier electrically serially following the noise cancellation circuit.

6. The PA module of claim 1, wherein the distortion cancellation circuit comprises a first distortion canceling amplifier electrically in parallel with a second distortion canceling amplifier, wherein the first distortion canceling amplifier cancels second order distortion in the LNA and the second distortion canceling amplifier cancels third order distortion in the LNA.

7. The PA module of claim 6, wherein the distortion cancellation circuit comprises a third distortion canceling amplifier electrically in series with the first and second distortion canceling amplifiers and electrically in parallel with the noise cancellation circuit.

8. The PA module of claim 1, wherein the distortion cancellation circuit comprises a first distortion canceling amplifier electrically in series with a second distortion canceling amplifier, wherein the first distortion canceling amplifier is electrically in parallel with the noise cancellation circuit.

9. The PA module of claim 1, further comprising a summation circuit summing current from the first path with current from the second path.

10. The PA module of claim 1, further comprising a summation circuit within the LNA, the summation circuit summing current from the first path with current from the second path.

11. The PA module of claim 1, wherein the LNA comprises an n-type field effect transistor (FET) (NFET) configured to be biased in a strong inversion.

12. The PA module of claim 11, wherein the second path comprises one or more p-type FETs (PFETs) configured to be biased in a weak inversion to create opposite sign distortion.

13. The PA module of claim 11, wherein the first path comprises the NFET configured to be biased in the strong inversion, and wherein the second path uses one or more other NFETs biased in a weak inversion to create opposite sign distortion.

14. The low noise amplifying system of claim 2, wherein the second signal path comprises a first stage configured to cancel second order distortion of the amplifying path and a second stage configured to cancel third order distortion of the amplifying path.

15. The low noise amplifying system of claim 2, wherein the second signal path comprises two or more separate stages to achieve independent noise and distortion cancellation.

16. A mobile communication device comprising:
a transceiver comprising a power amplifier module comprising:
    a first path coupling an input node and an output node, the first path comprising a low noise amplifier (LNA); and a second path coupling the input node and the output node, the second path electrically parallel to the first path, the second path comprising cancellation circuitry comprising:
        a noise cancellation circuit comprising a noise canceling amplifier configured to adjust an impedance at the input node; and
        a distortion cancellation circuit, such that the PA module is inductor-less.

17. A mobile communication device comprising:
a transceiver comprising a low noise amplifying system comprising:
    a first signal path comprising an amplifying path; and
    a second signal path comprising a cancellation path configured to cancel noise and distortion independently,
    wherein devices in the amplifying path are configured to create distortion having a first value and a first sign, and devices in the second signal path are configured to create distortion having approximately the first value and a second sign opposite the first sign, and
    wherein the first signal path and the second signal path are inductor-less.

\* \* \* \* \*